(12) United States Patent
Schmidt et al.

(10) Patent No.: US 11,449,442 B2
(45) Date of Patent: Sep. 20, 2022

(54) SINGLE COMMAND FOR READING THEN CLEARING A MEMORY BUFFER

(71) Applicant: KYOCERA Document Solutions Inc., Osaka (JP)

(72) Inventors: Kenneth Allen Schmidt, Redondo Beach, CA (US); Kendrick Esperanza Wong, Torrance, CA (US)

(73) Assignee: KYOCERA Document Solutions Inc., Osaka (JP)

( * ) Notice: Subject to any disclaimer, the term of this patent is extended or adjusted under 35 U.S.C. 154(b) by 277 days.

(21) Appl. No.: 16/818,793

(22) Filed: Mar. 13, 2020

(65) Prior Publication Data
US 2021/0286742 A1 Sep. 16, 2021

(51) Int. Cl.
| | |
|---|---|
| *G06F 13/16* | (2006.01) |
| *G06F 3/12* | (2006.01) |
| *G11C 11/401* | (2006.01) |
| *G06T 1/60* | (2006.01) |
| *G06F 9/30* | (2018.01) |

(52) U.S. Cl.
CPC .......... *G06F 13/1673* (2013.01); *G06F 3/122* (2013.01); *G06F 3/126* (2013.01); *G06F 3/1279* (2013.01); *G06F 9/3004* (2013.01); *G06T 1/60* (2013.01); *G11C 11/401* (2013.01)

(58) Field of Classification Search
None
See application file for complete search history.

(56) References Cited

U.S. PATENT DOCUMENTS

| | | | |
|---|---|---|---|
| 5,413,419 A | 5/1995 | Oami et al. | |
| 5,802,587 A * | 9/1998 | Ishikawa | G06F 13/161 711/155 |
| 7,031,019 B1 | 4/2006 | Sakurai | |
| 2009/0300313 A1 | 12/2009 | Doi | |

* cited by examiner

*Primary Examiner* — James G Norman
(74) *Attorney, Agent, or Firm* — GrowIP Law Group LLC (57) ABSTRACT

An example printing method can involve a memory buffer of a printing system containing image data, and the method can include (i) issuing, by an initiator of the printing system, a single read-then-clear memory command; (ii) receiving, by a memory controller of the printing system, the single read-then-clear memory command; and (iii) in response to receiving the single read-then-clear memory command, the memory controller both (a) reading the image data from the memory buffer of the printing system and (b) after reading the image data, clearing the image data from the memory buffer of the printing system.

14 Claims, 6 Drawing Sheets

SINGLE COMMAND FOR READING THEN CLEARING A MEMORY BUFFER

BACKGROUND

In recent years, various types of printing devices have become popular for both business and consumer use. In addition to traditional black and white printers, color printers, scanners, copiers, fax machines, and other components are now common. Multi-function peripherals (MFPs) that support two or more of these functions are also widely available.

Among other functions, these printing devices are used to print graphics or text onto a printing surface, such as paper. Such printing processes can involve reading and writing data into various memory buffers. For instance, image data can be written into a first memory buffer, the image data can be read from the first memory buffer, the image data can be processed and written into a second memory buffer, and the first memory buffer can be cleared for reuse. This process can involve receiving and executing various commands, such as read commands for reading the image data from the first memory buffer, as well as write commands for writing the image data into the first and second memory buffers and for clearing the first memory buffer.

It is desirable to improve on these arrangements or at least to provide one or more useful alternatives to help to improve printing processes.

SUMMARY

In one aspect, a method is described. The method can involve a memory buffer of a printing system, wherein the memory buffer contains image data, and the method includes (i) issuing, by an initiator of the printing system, a single read-then-clear memory command; (ii) receiving, by a memory controller of the printing system, the single read-then-clear memory command; and (iii) in response to receiving the single read-then-clear memory command, the memory controller (a) reading the image data from the memory buffer of the printing system and (b) after reading the image data, clearing the image data from the memory buffer of the printing system.

In a further aspect, a printing system is described. The printing system can include (i) a memory buffer containing image data; (ii) an initiator; and (iii) a memory controller. The printing system can be configured to perform a set of operations including (i) issuing, by the initiator, a single read-then-clear memory command; (ii) receiving, by the memory controller, the single read-then-clear memory command; and (iii) in response to receiving the single read-then-clear memory command, the memory controller (a) reading the image data from the memory buffer of the printing system and (b) after reading the image data, clearing the image data from the memory buffer of the printing system.

In a further aspect, a memory controller is described. The memory controller can be configured to perform a set of operations including (i) writing image data into a memory buffer of a printing system; (ii) receiving, from an initiator, a single read-then-clear memory command; and (iii) in response to receiving the single read-then-clear memory command, (a) reading the image data from the memory buffer of the printing system and (b) after reading the image data, clearing the image data from the memory buffer of the printing system.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

DETAILED DESCRIPTION

Example methods and systems are described herein. Other example embodiments or features may further be utilized, and other changes may be made, without departing from the scope of the subject matter presented herein. In the following detailed description, reference is made to the accompanying figures, which form a part thereof.

The ordinal terms first, second, and the like in the description and in the claims are used for distinguishing between similar elements and not necessarily for describing a sequence, either temporally, spatially, in ranking, or in any other manner. As such, it is to be understood that the ordinal terms can be interchangeable under appropriate circumstances.

The example embodiments described herein are not meant to be limiting. Thus, aspects of the present disclosure, as generally described herein and illustrated in the figures, can be arranged, substituted, combined, separated, and designed in a wide variety of different configurations, all of which are explicitly contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. OVERVIEW

Illustrative embodiments relate to example printing systems and corresponding printing methods. However, the systems and methods disclosed herein should not be viewed as being limited to printing technologies and can instead be applied to any system or method that involves reusing memory buffers. In connection with printing systems and methods, aspects of the present disclosure can be used to reduce the amount and time of computational processing of image data when printing an image. As used herein, the term "image data" can refer to pictorial data, textual data, and/or any other data that is destined to be reproduced in printed form.

In example arrangements, a printing system can include multiple memory buffers for processing image data to facilitate printing an image. In particular, printing can involve a pipeline of multiple processes that read from one memory buffer and write to another memory buffer. The memory buffers can be reused throughout the printing process. For instance, after image data has been read from a first memory buffer, processed, and written into a second memory buffer, the first memory buffer can be reused. For some types of processes, the first step of reusing a memory buffer is initializing the memory buffer. Initializing a memory buffer can involve writing zeros into the memory buffer.

In a conventional printing system, each of the above steps can involve issuing a series of memory commands. For instance, reading data from the first memory buffer can involve issuing a series of read commands, writing the processed data into the second memory buffer can involve issuing another series of write commands, and clearing the first memory buffer can involve issuing yet another series of write commands. In a system carrying out a large number of these printing processes across a large number of memory buffers, issuing separate series of commands for each of these operations can consume significant computational resources and time. Further, each write command can include a payload of write data that is to be written as a result of executing the command. Processing the write data for each series of write commands can further increase the computational resources and time consumed by these printing processes.

The present disclosure provides printing systems and methods for reducing the computational resources and time consumed during the printing process. In particular, the present disclosure provides systems and methods for using a series of single read-then-clear commands to read data from a memory buffer and subsequently clear the memory buffer for reuse.

Using single read-then-clear commands provides a number of improvements. One improvement is that the number of memory commands issued, transferred, received, and processed can be reduced. For instance, the steps of reading data from a memory buffer and writing zeros to that memory buffer can be carried out by issuing singular read-then-clear commands, instead of issuing two separate series of commands, namely a series of read commands and a series of write commands. Another improvement is that the quantity of write data that is issued, transferred, and processed during printing can be reduced. For instance, as noted above, when clearing a memory buffer a conventional write command usually includes write data that specifies writing zeros into the memory buffer, but in accordance with the present disclosure, a memory controller of a printing system can be designed to automatically infer writing zeros into the memory buffer in response to receiving the read-then-clear command. Other benefits will be apparent to those skilled in the art.

II. EXAMPLE SYSTEMS AND METHODS

Figure 1:
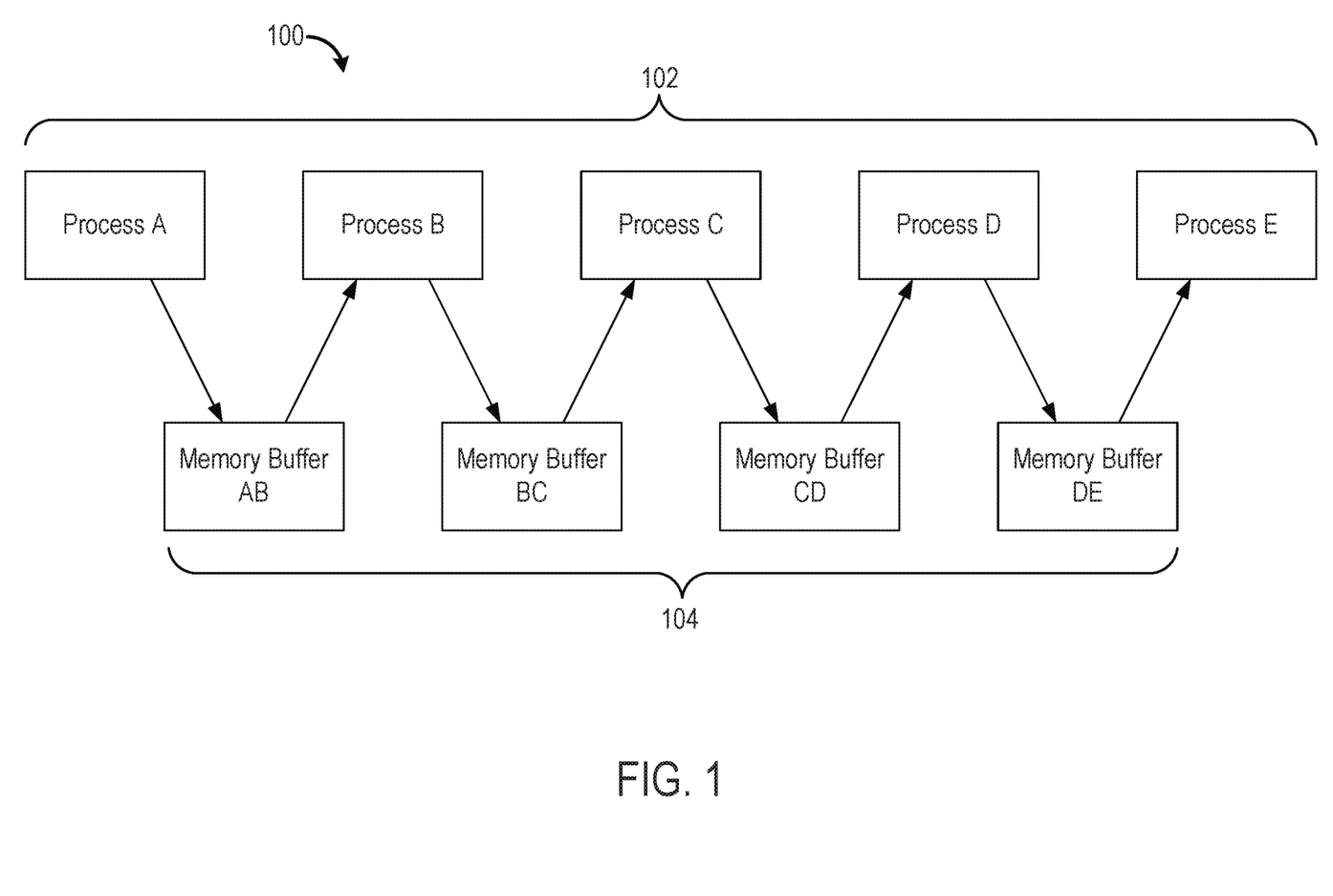
FIG. 1 is a flow diagram of a printing process, according to an example embodiment.

FIG. 1 depicts a flow diagram of a printing pipeline 100, according to an example embodiment. As shown, the printing pipeline 100 can include various processes 102 (identified as Process A, Process B, Process C, Process D, and Process E) performed on various memory buffers 104 (identified as Memory Buffer AB, Memory Buffer BC, Memory Buffer CD, and Memory Buffer DE). As described in further detail below, the processes 102 can involve reading and writing data to and from the memory buffers 104.

The processes 102 can be performed by various memory components of a printing system, including initiators that issue memory commands, a memory network for funneling the commands to a memory controller, and the memory controller for managing the timing of the commands. Such components are explained in further detail below, and some or all of these components can take the form of, or be included as part of, logic circuitry or a hardware module that processes data, such as one or more general purpose processors and/or one or more dedicated processors (e.g., application specific integrated circuits (ASICs) or digital signal processors (DSPs), etc.).

In the context of FIG. 1, Process A can involve initializing Memory Buffer AB and rendering image data into the initialized Memory Buffer AB. Initializing Memory Buffer AB can involve clearing Memory Buffer AB by writing zeros into Memory Buffer AB. As such, Process A can involve issuing a series of write operations that identify sequential addresses in Memory Buffer AB and that include write data indicating that zeros are to be written throughout Memory Buffer AB. Rendering the image data into the initialized Memory Buffer AB can involve issuing a series of read and write operations that identify addresses in Memory Buffer AB and that, for write operations, include write data indicating the image data that is to be written into Memory Buffer AB.

As an example, rendering image data into the initialized Memory Buffer AB can involve adding a number of objects to Memory Buffer AB. Objects can include individual characters or vector objects, such as lines, rectangles, circles, photographs, or the like. Objects can overlap, such that adding objects to Memory Buffer AB can involve adding a subsequent object "on top of" a previously rendered object. This can involve blending the overlapping portion of the objects, such that adding the subsequent object involves reading data from Memory Buffer AB that corresponds to the overlapping portion of the objects, computing data that corresponds to the blend of the objects, and writing the blended object data into Memory Buffer AB.

Process B can involve reading the image data from Memory Buffer AB, processing the image data, and writing the processed data into Memory Buffer BC. Reading the image data from Memory Buffer AB can involve issuing a read operation that identifies Memory Buffer AB as the read address. Process B can further involve causing the read image data to be processed in various ways, such as by compressing the image data, color converting the image data, halftoning the image data, or transmitting the image data to another computing device, such as to another chip, disk, controller board, system, or computer. Process B can then involve writing the processed image data into Memory Buffer BC. Writing the processed image data into Memory Buffer BC can involve issuing a write operation that identifies Memory Buffer BC as the write address and that includes write data indicating the processed image data that is to be written into Memory Buffer BC.

With the image data having been read from Memory Buffer AB, processed, and written into Memory Buffer BC, Memory Buffer AB can be reused in connection with different image data. For instance, Memory Buffer AB can be reinitialized by writing zeros into Memory Buffer AB, and new image data can be rendered into Memory Buffer AB.

Processes C, D, and E can involve performing operations similar to those described above in connection with Processes A and B, but in connection with Memory Buffers BC, CD, and DE. Further, the printing pipeline 100 can involve carrying out some or all of the above processes a number of times when printing an image.

Figure 2A:
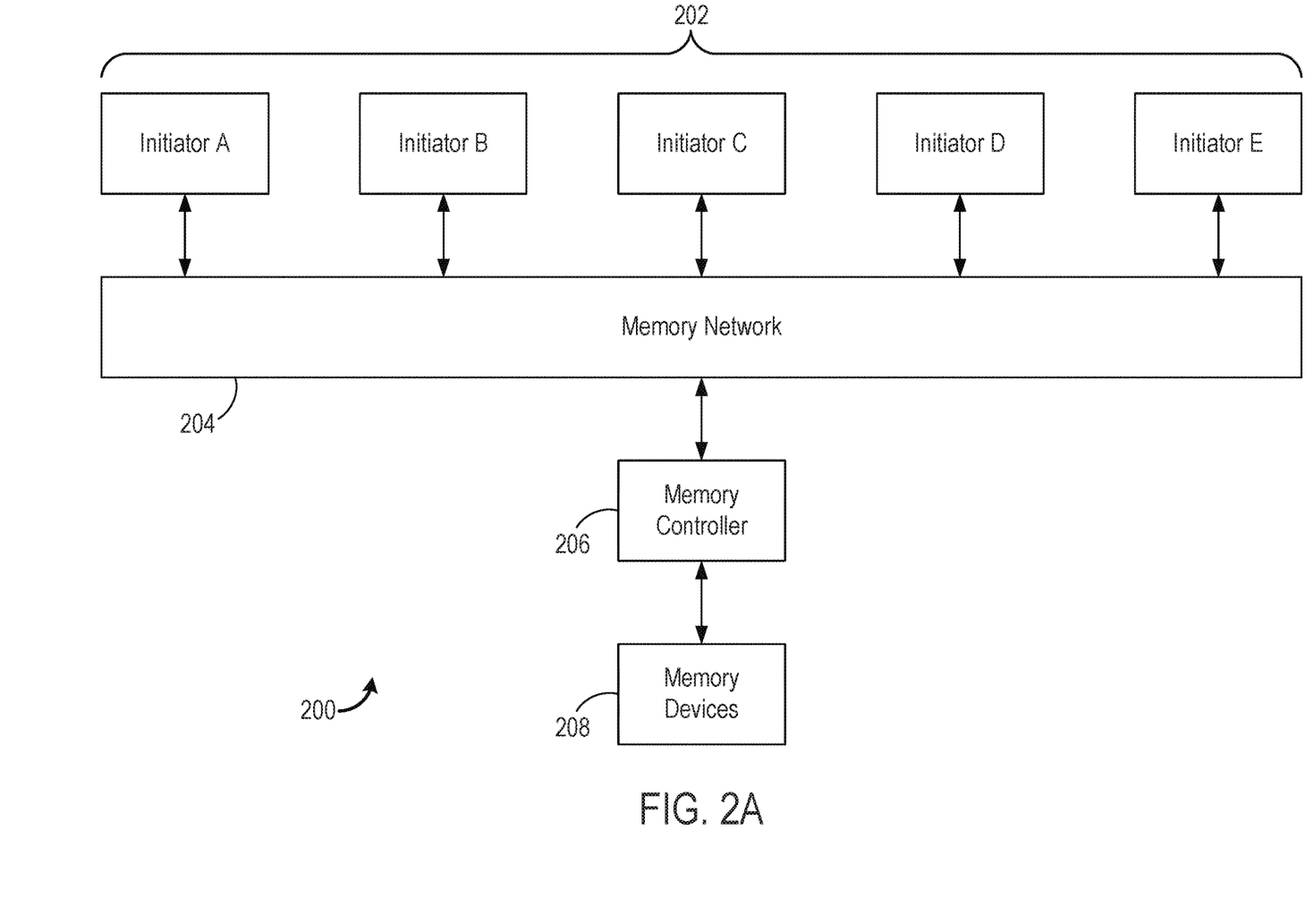
FIG. 2A is a simplified block diagram of a printing system, according to an example embodiment.
Figure 2B:
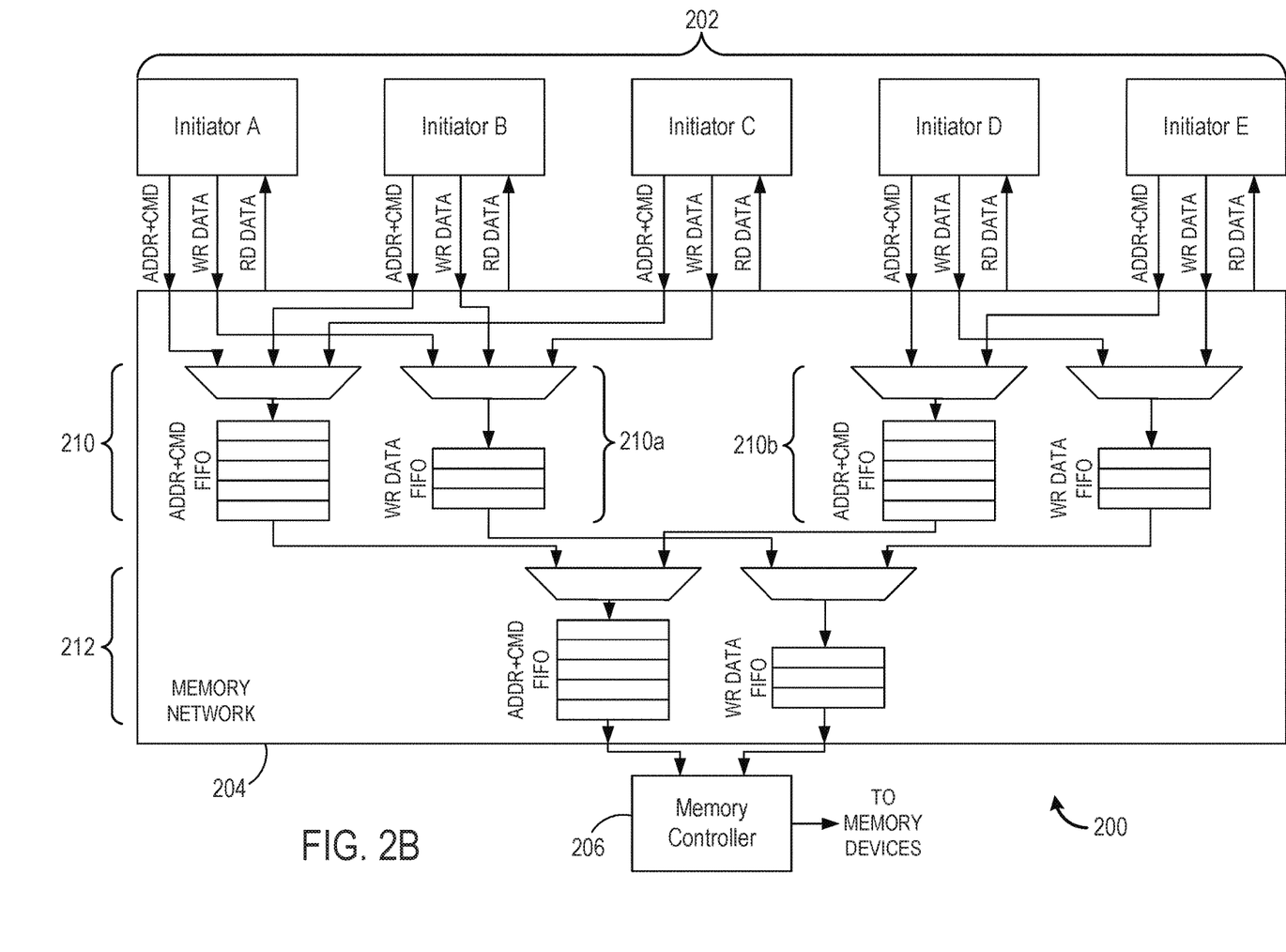
FIG. 2B is another simplified block diagram of the printing system depicted in FIG. 2A, according to an example embodiment.
Figure 2C:
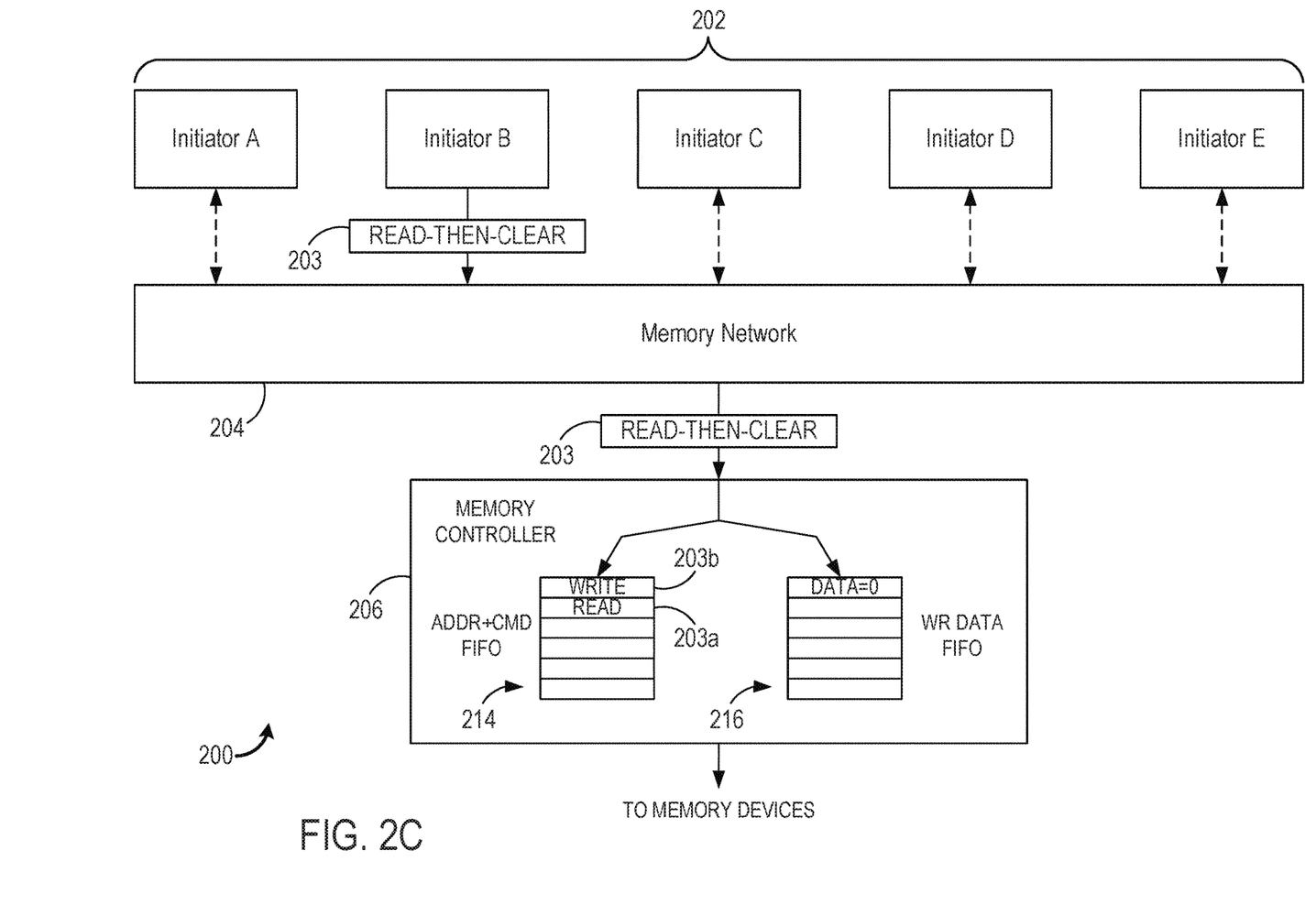
FIG. 2C is another simplified block diagram of the printing system depicted in FIG. 2A, according to an example embodiment.

FIGS. 2A-2C next illustrate in more detail how a printing system processes and stores image data using a printing pipeline, such as the printing pipeline 100 depicted in FIG. 1.

FIG. 2A illustrates a printing system 200, according to an example embodiment. The printing system 200 depicted in FIG. 2A can be capable of performing the processes 102 in the printing pipeline 100 depicted in FIG. 1. As shown, the printing system 200 can include various initiators 202 (identified as Initiator A, Initiator B, Initiator C, Initiator D, and Initiator E). The printing system 200 can further include a memory network 204, a memory controller 206, and memory devices 208. The memory devices 208 can include memory buffers, which can be similar to or the same as the memory buffers 104 depicted in FIG. 1. The initiators 202, memory network 204, memory controller 206, and memory devices 208 can be interconnected by a system bus or similar mechanism.

During a printing process, the initiators 202 can initiate one or more memory commands that can involve reading from and/or writing to the memory buffers of the memory devices 208. A memory command packages a request to read from or write to memory and can include (i) a type of memory operation (e.g., read, write, or, as described herein, read-then-clear), also referred to as a memory command, (ii) a memory address at which to perform the operation, and (iii) in examples where the command is a write command, write data to be written at the memory address.

The memory network 204 can receive memory commands issued by the initiators 202. The memory network 204 can arbitrate and multiplex the memory commands to prioritize the order in which the memory commands are provided to the memory controller 206. The memory controller 206 can further modify the order of the commands and translate the memory commands to device commands before issuing the device commands to the memory devices 208. This additional level of reordering can also be useful to comply with the timing requirements of the memory devices 208. Memory devices like dynamic random access memory (DRAM) can have complex timing requirements. As such, the ordering of read operations, write operations, and accesses to various memory locations can have a significant effect on a throughput of the memory devices 208.

The memory controller 206 can include a scheduler, in the form of logic circuitry, to manage the order of the commands. The scheduler is designed to generate a sequence of device commands that maximizes throughput of memory devices. The scheduler's ability to do so, in part, depends on the variety of commands the scheduler can select from. More commands can yield more variety, so the flow of commands into the memory controller 206 can be an important factor for providing a scheduler with the capability of generating an improved or optimal sequence.

FIG. 2B illustrates the printing system 200 with the memory network 204 shown in more detail to further illustrate its functionality.

The memory network 204 connects the initiators 202 to the memory controller 206. The memory network 204 accepts read and/or write commands from each initiator 202, and the memory network 204 arbitrates and multiplexes the commands until a single read or write command is funneled into the memory controller 206.

In order to facilitate this funneling of commands to the memory controller 206, the memory network 204 can include multiple levels of first in first out (FIFO) buffers and multiplexers. As shown, the memory network 204 includes two levels of FIFO buffers and multiplexers, including a first level 210 and a second level 212. The first level 210 includes a first subset 210a of FIFO buffers and multiplexers and a second subset 210b of FIFO buffers and multiplexers. However, the arrangement depicted in FIG. 2B is for illustrative purposes only, and in other examples the memory network 204 can include additional or fewer levels and/or in different configurations.

The first subset 210a of FIFO buffers and multiplexers can receive commands from Initiator A, Initiator B, and Initiator C, and the first subset 210a of FIFO buffers and multiplexers funnels data from those commands into an address and command (ADDR+CMD) FIFO buffer and a write data (WR DATA) FIFO buffer. Similarly, the second subset 210b of FIFO buffers and multiplexers can receive commands from Initiator D and Initiator E, and the second subset 210b of FIFO buffers and multiplexers funnels data from those commands into another ADDR+CMD FIFO buffer and WR DATA FIFO buffer.

The second subset 210b of FIFO buffers and multiplexers can then funnel the data from the ADDR+CMD FIFO buffers and WR DATA buffers of the first level 210 into a single ADDR+CMD FIFO buffer and WR DATA FIFO buffer for output to the memory controller 206.

FIG. 2C illustrates the printing system 200 with the memory controller 206 shown in more detail to further illustrate its functionality.

The memory controller 206 can include various FIFO buffers to support the flow of addresses, read data, and write data into, out of, and through the memory controller 206. For instance, the memory controller 206 can include a first FIFO buffer for addresses and commands received from the memory network 204, a second FIFO buffer for write data received from the memory network 204, and a third FIFO buffer for read data received from the memory devices 208 for forwarding to the memory network 204. For simplification purposes, FIG. 2C only shows an ADDR+CMD FIFO buffer 214 and a WR DATA FIFO buffer 216 of the memory controller 206.

In operation, one of the initiators 202 can issue a single read-then-clear memory command 203. In line with the discussion above, a read-then-clear command is a single command that causes the memory controller 206 to perform both a read operation and a subsequent initializing write operation on the same memory address. The read-then-clear memory command is similar to a read command, in that it specifies a memory address and does not specify write data. But unlike a read command, the read-then-clear command also causes zeroes to be written into the specified memory address when executed.

As shown in FIG. 2C, the present example depicts Initiator B issuing the read-then-clear command 203, but any of the initiators 202 can issue the read-then-clear command 203 in other examples. Initiator B provides the command to the memory network 204, and the memory network 204 treats the read-then-clear command 203 as it would any other individual memory command. Namely, referring back to FIG. 2B, the memory network 204 can enqueue the read-then-clear command 203 into the ADDR+CMD FIFO buffer of the first subset 210a of the first level 210 of FIFO buffers and multiplexers. And once the read-then-clear command 203 has passed through that buffer, the memory network 204 can enqueue the read-then-clear command 203 into the ADDR+CMD FIFO buffer of the second level 212 of FIFO buffers and multiplexers. And once the read-then-clear command 203 has passed through that buffer, the memory network 204 can pass the read-then-clear command 203 to the memory controller 206.

Returning to FIG. 2C, after receiving the single read-then-clear command 203 from the memory network 204, the memory controller 206 can divide the single read-then-clear command 203 into two distinct commands, including a read command 203a and a write command 203b. As described above, the single read-then-clear command 203 specifies a memory address. As such, when dividing the read-then-clear command 203 into the read command 203a and the write command 203b, the memory controller 206 would generate the read command 203a for the memory address specified by the read-then-clear command 203, as well as the write command 203b for that same memory address specified by the read-then-clear command 203.

Once the memory controller 206 divides the read-then-clear command 203 into the read command 203a and the write command 203b, the memory controller 206 can first enqueue the read command 203a into the ADDR+CMD FIFO buffer 214 of the memory controller 206, as shown in FIG. 2C. As noted above, the enqueued read command 203a would specify the same memory address as the address specified by the read-then-clear command 203. After enqueuing the read command 203a, the memory controller 206 can then enqueue the write command 203b into the ADDR+CMD FIFO buffer 214 of the memory controller 206. Similarly, the enqueued write command 203b would specify the same memory address as the address specified by the read-then-clear command 203. Additionally, when enqueuing the write command 203a, the memory controller 206 can specify the write data to include all zeros, by enqueuing this value into WR DATA FIFO buffer 216. This is consistent with the "clear" portion of the read-then-clear command, as clearing a memory location can involve initializing the memory location by writing zeros to that memory location.

The memory controller 206 can then process the enqueued read and write commands as it would any other read and write commands. Namely, the memory controller 206 can process enqueued commands in their queued order, including processing the enqueued read command 203a in the ADDR+CMD FIFO buffer 214 and afterwards the enqueued write command 203b. In this manner, the read and write operations are performed on the exact same location of memory devices 208, using the singular address specified by the read-then-clear command 203.

In line with the discussion above, the read-then-clear command 203 is designed to perform the read operation at the specified memory address and then subsequently perform the write operation to initialize the specified memory address. Performing the write operation before the read operation can result in undesirable consequences, as the original data at the memory address can no longer be read once the memory address has been initialized.

In order to prevent the write operation from being performed before the read operation, the memory controller 206 can be configured to take certain precautions when enqueuing the read and write commands that the memory controller derives from the read-then-clear commands. Namely, in line with the discussion above, when the memory controller divides the single read-then-clear command 203 into the read command 203a and the write command 203b, the memory controller 206 can be configured to enqueue the read command 203a in the ADDR_CMD FIFO buffer before enqueuing the write command 203b in the ADDR_CMD FIFO buffer. By enqueuing the read command 203a first, the read command 203a can pass through the ADDR+CMD FIFO buffer before the write command 203b passes through the buffer. In some examples, the memory controller 206 can wait a predefined amount of time between enqueuing the read command 203a and subsequently enqueuing the write command 203b. Furthermore, as described above, reordering of the read and write commands enqueued into ADDR+CMD FIFO buffer 214 must be disabled.

Figure 3:
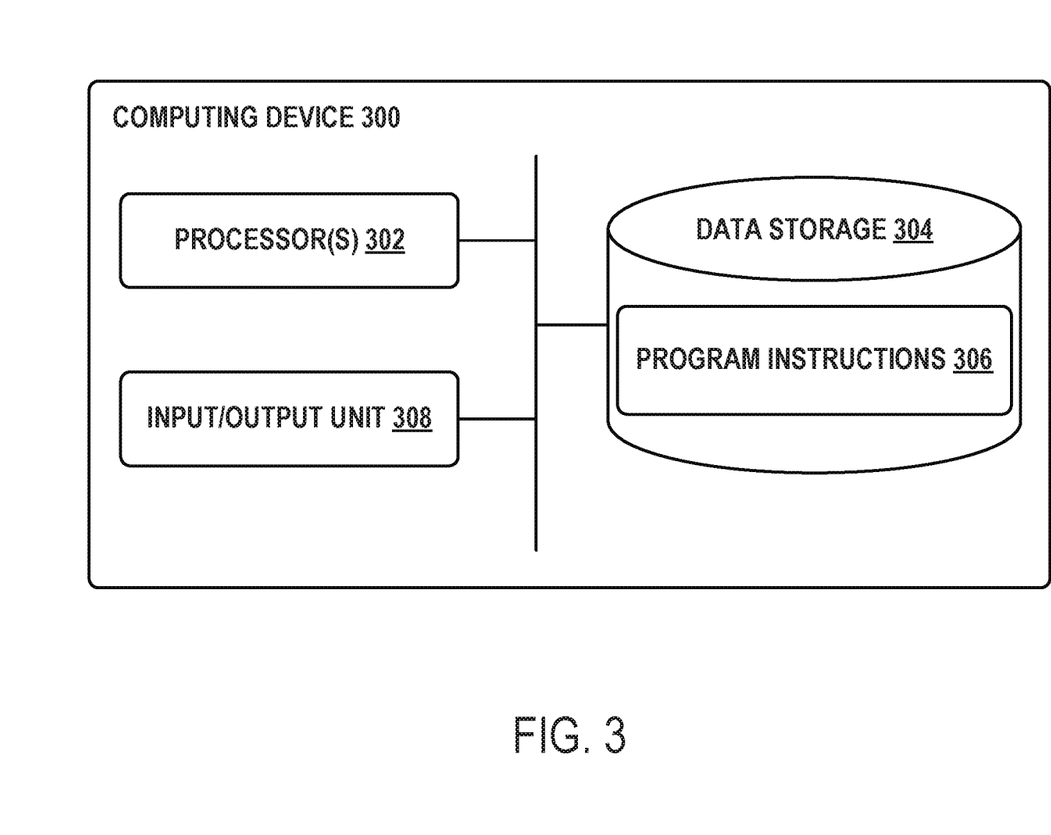
FIG. 3 is a simplified block diagram of a computing device, according to an example embodiment.

FIG. 3 illustrates a simplified block diagram of a computing device 300, which can be configured to carry out the methods, processes, or functions disclosed in this specification and/or the accompanying drawings. Any of the components described above, such as the initiators 202, the memory network 204, and/or the memory controller 206, can be implemented as, or can be integrated within, the computing device 300. Generally, the manner in which the computing device 300 is implemented can vary, depending upon the particular application.

The computing device 300 can include one or more processors 302, data storage 304, program instructions 306, and an input/output unit 308, all of which can be coupled by a system bus or a similar mechanism. The one or more processors 302 can include one or more central processing units (CPUs), such as one or more general purpose processors and/or one or more dedicated processors (e.g., application specific integrated circuits (ASICs) or digital signal processors (DSPs), etc.). The one or more processors 302 can be configured to execute computer-readable program instructions 306 that are stored in the data storage 304 and are executable to provide at least part of the functionality described herein.

The data storage 304 can include or take the form of one or more non-transitory, computer-readable storage media that can be read or accessed by at least one of the one or more processors 302. The non-transitory, computer-readable storage media can include volatile and/or non-volatile storage components, such as optical, magnetic, organic, or other memory or disc storage, which can be integrated in whole or in part with at least one of the one or more processors 302. In some embodiments, the data storage 304 can be implemented using a single physical device (e.g., one optical, magnetic, organic, or other memory or disc storage unit), while in other embodiments, the data storage 304 can be implemented using two or more physical devices.

The input/output unit 308 can include network input/output devices. Network input/output devices can include wired network receivers and/or transceivers, such as an Ethernet transceiver, a Universal Serial Bus (USB) transceiver, or similar transceiver configurable to communicate via a twisted pair wire, a coaxial cable, a fiber-optic link, or a similar physical connection to a wireline network, and/or wireless network receivers and/or transceivers, such as a Bluetooth transceiver, a Zigbee transceiver, a Wi-Fi transceiver, a WiMAX transceiver, a wireless wide-area network (WWAN) transceiver and/or other similar types of wireless transceivers configurable to communicate via a wireless network.

The input/output unit 308 can additionally or alternatively include user input/output devices and/or other types of input/output devices. For example, the input/output unit 308 can include a touch screen, a keyboard, a keypad, a computer mouse, liquid crystal displays (LCD), light emitting diodes (LEDs), displays using digital light processing (DLP) technology, cathode ray tubes (CRT), light bulbs, and/or other similar devices.

Figure 4:
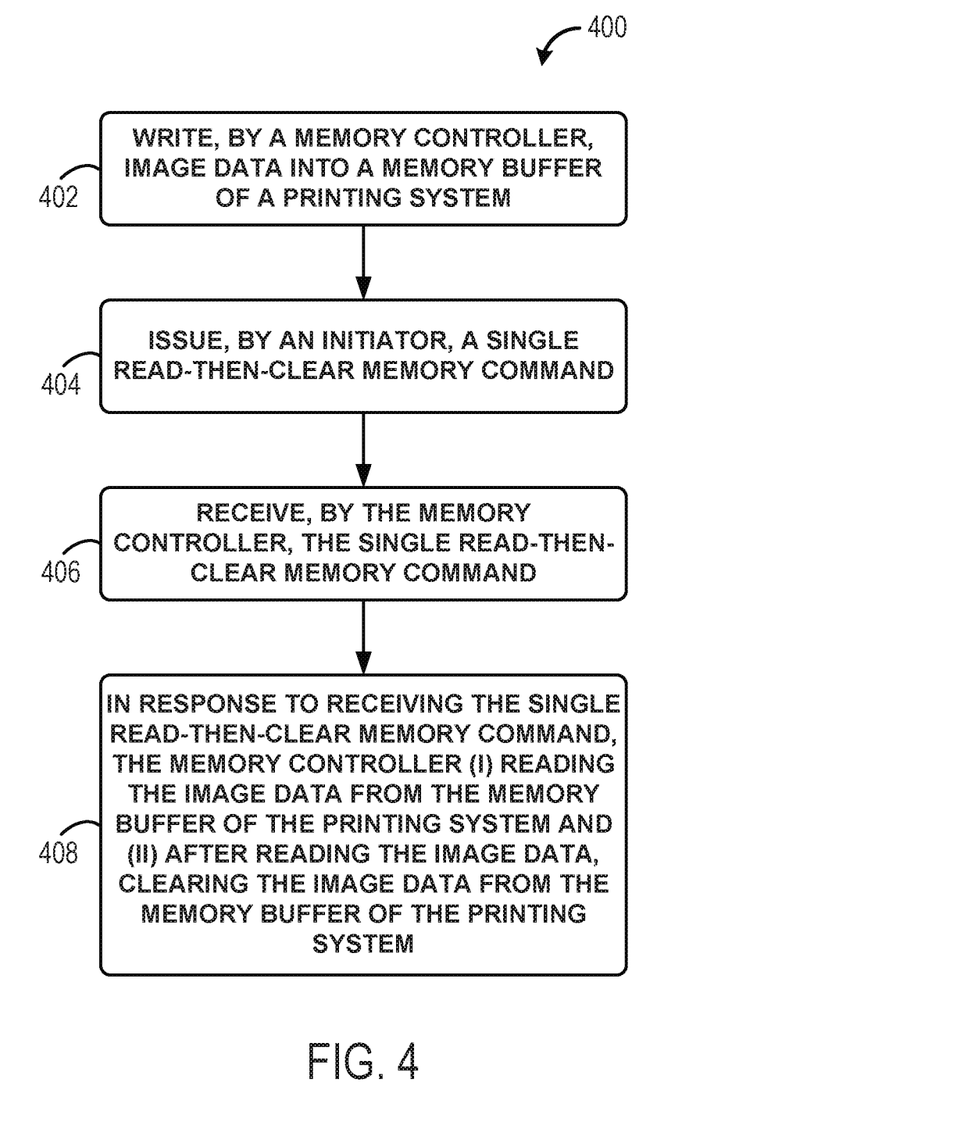
FIG. 4 is a flowchart of a method, according to an example embodiment.

FIG. 4 depicts a flowchart of an example method 400 that can be carried out in connection with one or more of the printing systems described herein. The example method 400 can include one or more operations, functions, or actions, as depicted by one or more of blocks 402, 404, 406, and/or 408, each of which can be carried out by the printing system 200 described by way of FIGS. 2A-C; however, other configurations could be used as well.

Furthermore, those skilled in the art will understand that the flowchart described herein illustrates functionality and operation of certain implementations of example embodiments. In this regard, each block of the flowchart can represent a module or a portion of program code, which includes one or more instructions executable by a processor for implementing, managing, or driving specific logical functions or steps in the method 400. The program code can be stored on any type of computer readable medium, for example, such as a storage device including a disk or hard drive. In addition, each block can represent circuitry that is wired to perform the specific logical functions in the method 400. Alternative implementations are included within the scope of the example embodiments of the present application in which functions can be executed out of order from that shown or discussed, including substantially concurrent order, depending on the functionality involved, as would be understood by those reasonably skilled in the art.

Referring to FIG. 4, method 400 begins at block 402, which involves a memory controller of a printing system writing image data into a memory buffer of the printing system. In some examples, the method 400 can involve the memory controller initializing the memory buffer of the printing system by writing zeros to the memory buffer before writing the image data into the memory buffer.

Method 400 continues at block 404, which involves an initiator of the printing system issuing a single read-then-clear memory command;

Method 400 continues at block 406, which involves the memory controller receiving the single read-then-clear memory command.

Method 400 continues at block 408, which involves in response to receiving the single read-then-clear memory command, the memory controller (i) reading the image data from the memory buffer of the printing system and (ii) after reading the image data, clearing the image data from the memory buffer of the printing system.

In some examples, the memory controller can maintain a command queue in which read operations and write operations are queued. In line with the discussion above, the command queue can be an ADDR+CMD FIFO buffer. In such examples, reading the image data from the memory buffer of the printing system can involve, in response to receiving the single read-then-clear memory command, adding a read operation to the command queue of the memory controller. Further, clearing the image data from the memory buffer of the printing system can involve, in response to receiving the single read-then-clear memory command, adding a write operation to the command queue of the memory controller.

In some examples, the single read-then-clear memory command can identify a memory address and can refrain from identifying write data to be written to the memory address. Further, adding the read operation to the command queue of the memory controller can involve adding, to the command queue of the memory controller, a read operation to read data at the memory address identified by the single read-then-clear memory command, and adding the write operation to the command queue of the memory controller can involve adding, to the command queue of the memory controller, a write operation to write zeros at the memory address identified by the single read-then-clear memory command.

In some examples, the memory controller further maintains a write-data queue in which data to be written to the memory buffer is queued. In line with the discussion above, the write-data queue can be a WR DATA FIFO buffer. In such examples, clearing the image data from the memory buffer of the printing system can further involve, in response to receiving the single read-then-clear memory command, adding, to the write-data queue of the memory controller, zeros to be written into the memory address identified by the single read-then-clear memory command.

In some examples, the memory controller of the printing system can be a DRAM controller.

In some examples, the memory buffer can be a first memory buffer of the printing system, and the method 400 can further involve (i) processing the image data read from the first memory buffer and (ii) writing the processed image data into a second memory buffer of the printing system. Processing the image data can involve compressing the image data, color converting the image data, halftoning the image data, or transmitting the image data to another computing device, such as to another chip, disk, controller board, system, or computer.

In addition to the operations depicted in FIG. 4, other operations can be utilized with the example printing systems presented herein.

The present disclosure described above provides improvements to systems and methods that involve reusing memory buffers by sending a single compound command through a memory network instead of two separate commands. Sending fewer commands frees address and command resources, such as the FIFO buffers in the memory network, so they can be used by other processes. By freeing up these resources, other processes can be performed sooner, which can improve the performance of other processing blocks and therefore the entire memory system.

III. CONCLUSION

The particular arrangements shown in the Figures should not be viewed as limiting. It should be understood that other embodiments can include more or less of each element shown in a given Figure. Further, some of the illustrated elements can be combined or omitted. Yet further, example embodiments can include elements that are not illustrated in the Figures.

Additionally, while various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are contemplated herein.

What is claimed is:
1. A method comprising:
rendering image data into a memory buffer of a printing system;

receiving a single read-then-clear memory command;
receiving a single read-then-clear memory command, wherein receiving the single read-then-clear memory command comprises receiving the single read-then-clear memory command by a memory controller of the printing system, wherein the single read-then-clear memory command identifies a memory address and refrains from identifying write data,
the memory controller maintains (i) a read queue in which read operations are queued and (ii) a write queue in which write operations are queued; and
in response to receiving the single read-then-clear memory command, (a) reading the image data from the memory buffer of the printing system, wherein reading the image data from the memory buffer of the printing system comprises, in response to receiving the single read-then-clear memory command, adding a read operation to the read queue of the memory controller, and (b) clearing the image data from the memory buffer of the printing system, wherein clearing the image data from the memory buffer of the printing system comprises, in response to receiving the single read-then-clear memory command, adding a write operation to the write queue of the memory controller;
wherein adding the read operation to the read queue of the memory controller comprises adding, to the read queue of the memory controller, a read operation to read data at the memory address identified by the single read-then-clear memory command, and
wherein adding the write operation to the write queue of the memory controller comprises adding, to the write queue of the memory controller, a write operation to write data at the memory address identified by the single read-then-clear memory command.

2. The method of claim 1, wherein adding the write operation to the write queue of the memory controller comprises adding a write operation to write zeros at the memory address identified by the single read-then-clear memory command.

3. The method of claim 1, further comprising:
before rendering the image data into the memory buffer of the printing system, initializing the memory buffer by writing zeros to the memory buffer.

4. The method of claim 1, wherein the memory buffer is a first memory buffer of the printing system, the method further comprising:
compressing the image data read from the first memory buffer; and
writing the compressed image data into a second memory buffer of the printing system.

5. The method of claim 1, wherein the memory controller is a dynamic random access memory (DRAM) controller.

6. A printing system comprising:
a memory buffer;
a memory controller; and
a non-transitory computer-readable medium having stored thereon program instructions that, upon execution by the memory controller, cause the printing system to perform a set of operations comprising:
rendering image data into the memory buffer of the printing system;
receiving a single read-then-clear memory command, wherein the single read-then-clear memory command identifies a memory address and refrains from identifying write data;
maintaining, by the memory controller, (i) a read queue in which read operations are queued and (ii) a write queue in which write operations are queued; and
in response to receiving the single read-then-clear memory command, (a) reading the image data from the memory buffer of the printing system, wherein reading the image data from the memory buffer of the printing system comprises, in response to receiving the single read-then-clear memory command, adding a read operation to the read queue of the memory controller, and (b) clearing the image data from the memory buffer of the printing system, wherein clearing the image data from the memory buffer of the printing system comprises, in response to receiving the single read-then-clear memory command, adding a write operation to the write queue of the memory controller;
wherein adding the read operation to the read queue of the memory controller comprises adding, to the read queue of the memory controller, a read operation to read data at the memory address identified by the single read-then-clear memory command, and
wherein adding the write operation to the write queue of the memory controller comprises adding, to the write queue of the memory controller, a write operation to write data at the memory address identified by the single read-then-clear memory command.

7. The printing system of claim 6, wherein adding the write operation to the write queue of the memory controller comprises adding a write operation to write zeros at the memory address identified by the single read-then-clear memory command.

8. The printing system of claim 6, the set of operations further comprising:
before rendering the image data into the memory buffer of the printing system, initializing the memory buffer by writing zeros to the memory buffer.

9. The printing system of claim 6, wherein the memory buffer is a first memory buffer of the printing system, wherein the printing system further comprises a second memory buffer, the set of operations further comprising:
compressing the image data read from the first memory buffer; and
writing the compressed image data into the second memory buffer.

10. The printing system of claim 6, wherein the memory controller is a dynamic random access memory (DRAM) controller.

11. A non-transitory, computer-readable medium having stored thereon program instructions that, upon execution by a memory controller of a printing system, cause the printing system to perform a set of operations comprising:
rendering image data into a memory buffer of the printing system;
receiving a single read-then-clear memory command, wherein the single read-then-clear memory command identifies a memory address and refrains from identifying write data;
maintaining, by the memory controller, (i) a read queue in which read operations are queued and (ii) a write queue in which write operations are queued; and
in response to receiving the single read-then-clear memory command, (a) reading the image data from the memory buffer of the printing system, wherein reading the image data from the memory buffer of the printing system comprises, in response to receiving the single read-then-clear memory command, adding a read operation to the read queue of the memory controller, and (b) clearing the image data from the memory buffer of the printing system, wherein clearing the image data from the memory buffer of the printing system comprises, in response to receiving the single read-then-clear memory command, adding a write operation to the write queue of the memory controller;

wherein adding the read operation to the read queue of the memory controller comprises adding, to the read queue of the memory controller, a read operation to read data at the memory address identified by the single read-then-clear memory command, and wherein adding the write operation to the write queue of the memory controller comprises adding, to the write queue of the memory controller, a write operation to write data at the memory address identified by the single read-then-clear memory command.

12. The non-transitory, computer-readable medium of claim 11, wherein adding the write operation to the write queue of the memory controller comprises adding a write operation to write zeros at the memory address identified by the single read-then-clear memory command.

13. The non-transitory, computer-readable medium of claim 11, the set of operations further comprising:
before rendering the image data into the memory buffer of the printing system, initializing the memory buffer by writing zeros to the memory buffer.

14. The non-transitory, computer-readable medium of claim 11, wherein the memory buffer is a first memory buffer of the printing system, wherein the printing system further comprises a second memory buffer, the set of operations further comprising:
compressing the image data read from the first memory buffer; and
writing the compressed image data into the second memory buffer.

\* \* \* \* \*